United States Patent [19]

Piasecki

[11] Patent Number: 4,567,381

[45] Date of Patent: Jan. 28, 1986

[54] BIAS NETWORK HAVING ONE MODE FOR PRODUCING A REGULATED OUTPUT

[75] Inventor: Douglas S. Piasecki, Leonardo, N.J.

[73] Assignee: RCA Corporation, Princeton, N.J.

[21] Appl. No.: 556,931

[22] Filed: Dec. 1, 1983

[51] Int. Cl.$^4$ .................. H03K 17/16; H03K 17/296; H03K 17/60

[52] U.S. Cl. ................. 307/296 R; 307/544; 307/549; 365/203; 323/315

[58] Field of Search ............ 307/296 R, 296 A, 603, 307/605, 608, 443, 544, 551, 558, 549; 323/311, 312, 315; 365/203, 205, 206, 190, 196

[56] References Cited

U.S. PATENT DOCUMENTS

| | | | |
|---|---|---|---|
| 3,651,346 | 3/1972 | Limberg | 307/296 R |
| 4,177,392 | 12/1979 | Haferl | 307/296 R X |
| 4,220,876 | 9/1980 | Ray | 307/296 R |
| 4,308,496 | 12/1981 | Nagano | 323/315 |
| 4,313,082 | 1/1982 | Neidorff | 323/312 |
| 4,473,794 | 9/1984 | Early et al. | 323/315 |

Primary Examiner—Stanley D. Miller
Assistant Examiner—David R. Bertelson
Attorney, Agent, or Firm—Joseph S. Tripoli; George E. Haas; Henry I. Schanzer

[57] ABSTRACT

A bias network includes a transistor connected at its emitter to a first point of operating potential. A current passing means is connected between a second point of operating potential and an intermediate point. A first diode is connected between the intermediate point and the base of the transistor and a second diode is connected between the intermediate point and the collector of the transistor for producing at the collector a regulated bias voltage. Means are included to selectively turn-off the transistor for causing the equivalent impedance at its collector to become high.

10 Claims, 5 Drawing Figures

BIAS NETWORK HAVING ONE MODE FOR PRODUCING A REGULATED OUTPUT

The Government has rights in this invention pursuant to Subcontract No. A1ZV-684213E-507 under Contract No. F04704-78C-0021 awarded by the Department of the Air Force.

This invention relates to a circuit which can be switched from one mode in which it is enabled and functions to produce a bias voltage at its output to another mode in which it is disabled and functions to produce a high output impedance at its output.

In many applications it is desirable to preset or precharge the input (or another) node of a circuit at a potential such that when an input signal is subsequently applied, the circuit can respond quickly. In many of these applications, it is important that the bias potential be regulated to ensure that it falls within a desired range and be reproducible under different operating conditions. Regulation requires that the output impedance of the bias network producing the bias potential be relatively low in order to hold its output at the predetermined value of bias voltage. The low output impedance of the bias network would tend to minimize the effect of input signals and to slow down the response of the circuit. Hence it is necessary to switch the output of the bias network to a high impedance condition, without altering the bias level, when the circuit is ready to respond to input signals.

A problem exists in that the bias network must be switched from one operating mode to another without disturbing the voltage at its output. Another problem exists in that the bias network must switch from one mode to the other very quickly. Still another problem is that it is desirable and/or necessary that the circuit be simple and require few components.

A biasing network embodying the invention may include a transistor which can either be biased to produce a regulated output voltage at its collector or be turned-off to produce a relatively high output impedance at its collector.

A circuit embodying the invention includes means for passing a current between a first point of operating potential and a first node. "M" diodes are connected in series between the first node and the base of a transistor whose emitter is connected to a second point of operating potential. The M diodes are poled to conduct current in the same forward direction as the base-to-emitter junction of the transistor. "N" diodes are connected in series between the first node and the collector of the transistor, the N diodes being poled to conduct in the same forward direction as the M diodes. "M" is an integer which is made equal to or greater than N whereby, when the circuit is enabled, the amplitude of the collector-to-emitter voltage of the transistor is regulated and is never significantly less than its base-to-emitter voltage. In one embodiment, M and N are set equal to one for maintaining the collector of the transistor at a voltage nearly equal to the voltage at its base.

In the accompanying drawing like reference characters denote like components; and FIG. 1 is a schematic diagram of a circuit embodying the invention;

Bipolar transistors and diodes used to illustrate the invention are assumed, for ease of discussion, to have the following characteristics. A Schottky diode is assumed to have a forward voltage drop ($V_{FS}$) of 0.5 volt at room temperature. The forward drop ($V_F$) of a conventional diode (PN junction) and the forward base-to-emitter voltage drop ($V_{BE}$) of the transistors used in the circuit (except for Q1 as noted below) are assumed to be equal to 0.7 volt at room temperature. The collector-to-emitter voltage ($V_{CE\ SAT}$) of a transistor driven into saturation is assumed to be 0.3 volt. Also, for purposes of the present discussion, it is assumed, arbitrarily, that a relatively high voltage level also referred to as "HIGH", represents the binary "1" state and a relatively LOW level also referred to as "LOW" represents the binary "0" state. For the sake of brevity in the explanation which follows, it is sometimes stated that a circuit point is low ("0") or high ("1") rather than stating that a signal representing a low or a high is applied to, or produced by or at, the circuit point.

Figure 1:
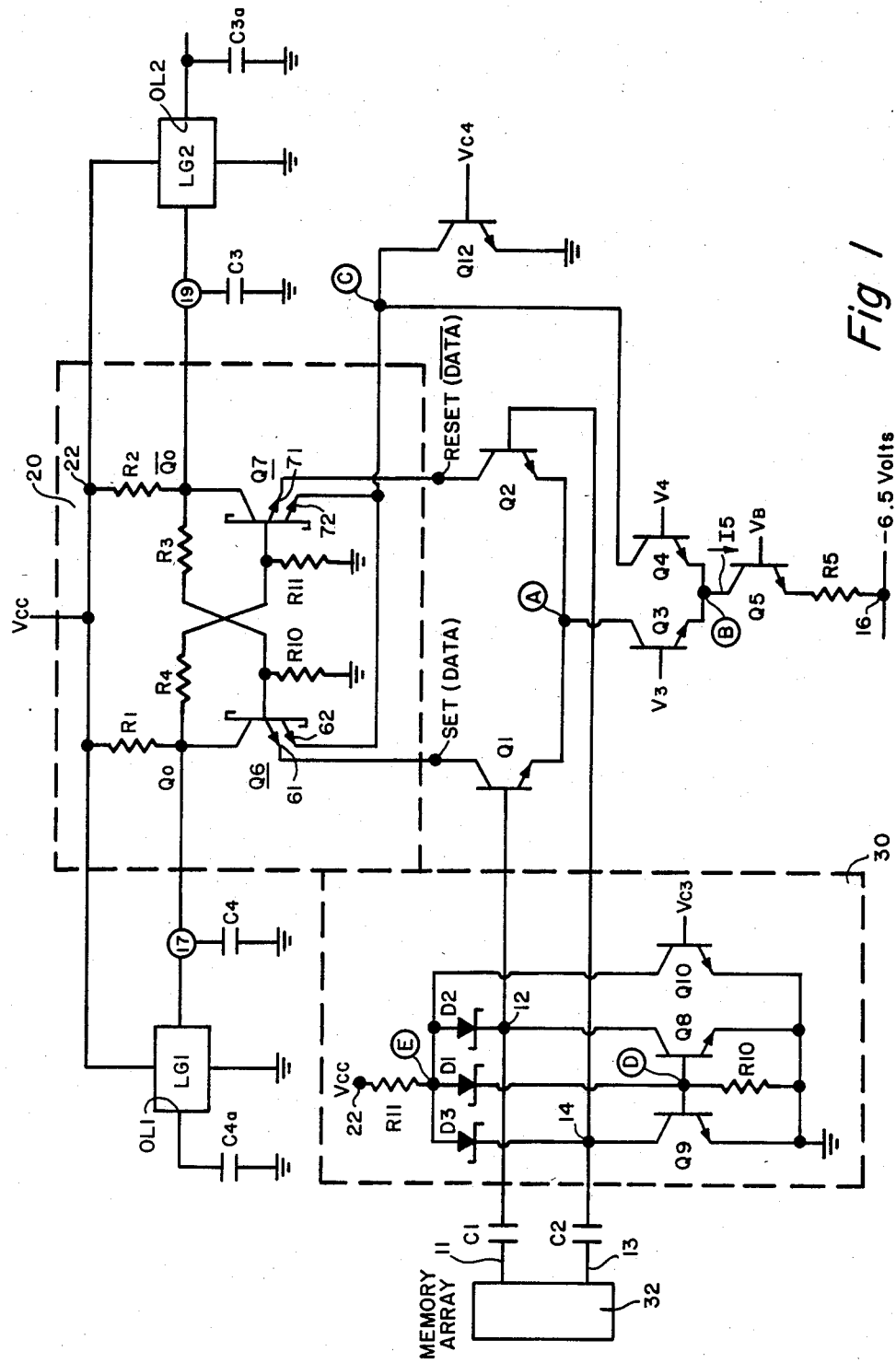

The circuit of FIG. 1 includes a differential amplifier, comprised of NPN transistors Q1 and Q2, which is capacitively coupled to first (11) and second (13) input terminals. For reasons discussed below transistors Q1 and Q2 have different physical dimensions. In this design Q1 is made twice the size of Q2 such that the base-to-emitter voltage ($V_{BE}$) of Q1 is less than the $V_{BE}$ of Q2 for like values of base and emitter currents. For ease of explanation, it is assumed in the discussion to follow that the $V_{BE}$ of Q1 is 0.6 volt and that the $V_{BE}$ of Q2 is 0.7 volt. A capacitor C1 is connected between terminal 11 and the base of Q1, and a capacitor C2 is connected between terminal 13 and the base of Q2. The emitters of Q1 and Q2 are connected at node A to the collector of an NPN transistor Q3. The emitter of NPN transistor Q4 is connected to the emitter of transistor Q3 at a node B. Control signals $V_3$ and $V_4$ are applied to the bases of Q3 and Q4, respectively, whereby Q3 and Q4 function as a differential current switch which is used to selectively supply emitter current to the differential amplifier. When Q3 is turned-on and Q4 is turned-off a current I5 is coupled via the collector-to-emitter path of Q3 to the emitters of Q1 and Q2. When Q3 is turned off and Q4 is turned on the current I5 flows via the collector-to-emitter path of Q4 out of node C. The current I5 is produced by a relatively constant current source means comprised of a transistor Q5 connected at its collector to node B and a resistor R5 connected between the emitter of Q5 and a terminal 16 to which is applied a negative potential of, for example, −6.5 volts. A fixed bias voltage VB is applied to the base of Q5 causing a relatively constant current I5 to flow in the collector of Q5. Depending on the values of V3 and V4, I5 will either flow through Q3 or through Q4. When V3 is more positive than V4 the current I5 can flow via Q3 out of node A, when V4 is more positive than V3 the current I5 can flow via Q4 out of node C.

The collectors of Q1 and Q2 which define the outputs of the differential amplifier are connected to set (data) and reset ($\overline{\text{data}}$) inputs of a flip-flop 20. Flip-flop 20 includes double-emitter NPN transistors Q6 and Q7 which are cross-coupled by means of resistors R3 and R4. That is, the collector of Q7 is connected to the base of Q6 via resistor R3 and the base of Q7 is connected to the collector of Q6 via resistor R4. The collectors of Q6 and Q7 are then respectively returned via load resistors R1 and R2 to a terminal 22 to which is applied a positive operating potential $V_{CC}$ of, for example, +5 volts. Emitter 61 of Q6, arbitrarily defined as the set input, is connected to the collector of Q1 and emitter 71 of Q7, arbitrarily defined as the reset input, is connected to the collector of Q2. Emitter 62 of Q6 and emitter 72 of Q7 are connected in common to node C.

Node C is selectively clamped to ground potential by means of NPN transistor Q12 whose collector is connected to node C, whose emitter is returned to ground, and to whose base is applied a control signal VC4. When Q12 is turned-on, emitters 62 and 72 are grounded and information previously entered into flip-flop 20 is statically stored.

The collector of Q6, at which is produced the Qo output, is connected to a terminal 17 to which is connected a logic gate, LG1, and the collector of Q7, at which is produced the $\overline{Qo}$ output, is connected to an output terminal 19 to which is connected a second logic gate LG2. The bases of Q6 and Q7 are returned to ground via resistors R10 and R11, respectively.

Flip-flop 20 is intrinsically unbalanced in that while its outputs (Qo and $\overline{Qo}$) can be discharged to the low level (i.e. close to ground) very quickly via the collector-to-emitter paths of Q6 or Q7, they are charged up to $V_{CC}$ via load resistors R1 and R2. The values of R1 and R2 cannot be made very small. Otherwise it becomes difficult to switch the flip-flop and its power dissipation becomes excessive. Thus the output capacitance can be discharged to the low level (e.g. ground) much more quickly than it can be charged up to the high level (e.g. $V_{CC}$). Consequently it takes longer for the output to go from the low level to the high level than from the high to the low level. The flip-flop is further unbalanced in that the capacitance associated with one output (e.g. C3 connected between terminal 19 and ground) is much greater than the capacitance associated with the other output (e.g. C4 connected between terminal 17 and ground). Where, for example, C3 is 10 times the size of C4, the time to charge C3 to $V_{CC}$ becomes very large. Using conventional techniques the rise time would exceed circuit specification and, as noted above, the problem cannot be resolved by decreasing the load resistance due to limitation on the switchability of the flip-flop and its permissible power dissipation.

A bias or clamping network 30 is coupled to the bases of Q1 and Q2. Network 30 includes means for establishing and maintaining a bias potential at its outputs which is applied to the bases of Q1 and Q2 prior to the presetting period and after data is sensed and stored. During the presetting period and while data is applied to the sense circuit, the outputs of network 30 appear as a high impedance and it has little, if any, effect on the input signals applied to the bases of Q1 and Q2. Network 30 includes NPN transistors Q8 and Q9 whose collectors are coupled to the bases of Q1 and Q2, respectively, whose emitters are connected to ground, and whose bases are connected to a node D. A ground return resistor R10 is connected betwen the bases of Q8 and Q9 and their emitters. The anodes of 3 Schottky diodes (D1, D2 and D3) are connected to a node E which is connected via a biasing resistor R11 to node 22 to which is applied $V_{CC}$ volts. The cathode of D1 is connected to node D, the cathode of D2 is connected to node 12 to which are connected the base of Q1 and the collector of Q8 and the cathode of D3 is connected to node 14 to which are connected the base of Q2 and the collector of Q9. Node E is selectively clamped to ground potential by means of NPN transistor Q10 whose collector is connected to node E, whose emitter is returned to ground potential and to whose base is applied a control signal VC3. Diodes D1, D2, D3 are shown to be Schottky diodes but other types of diodes could be used instead.

Figure 2:
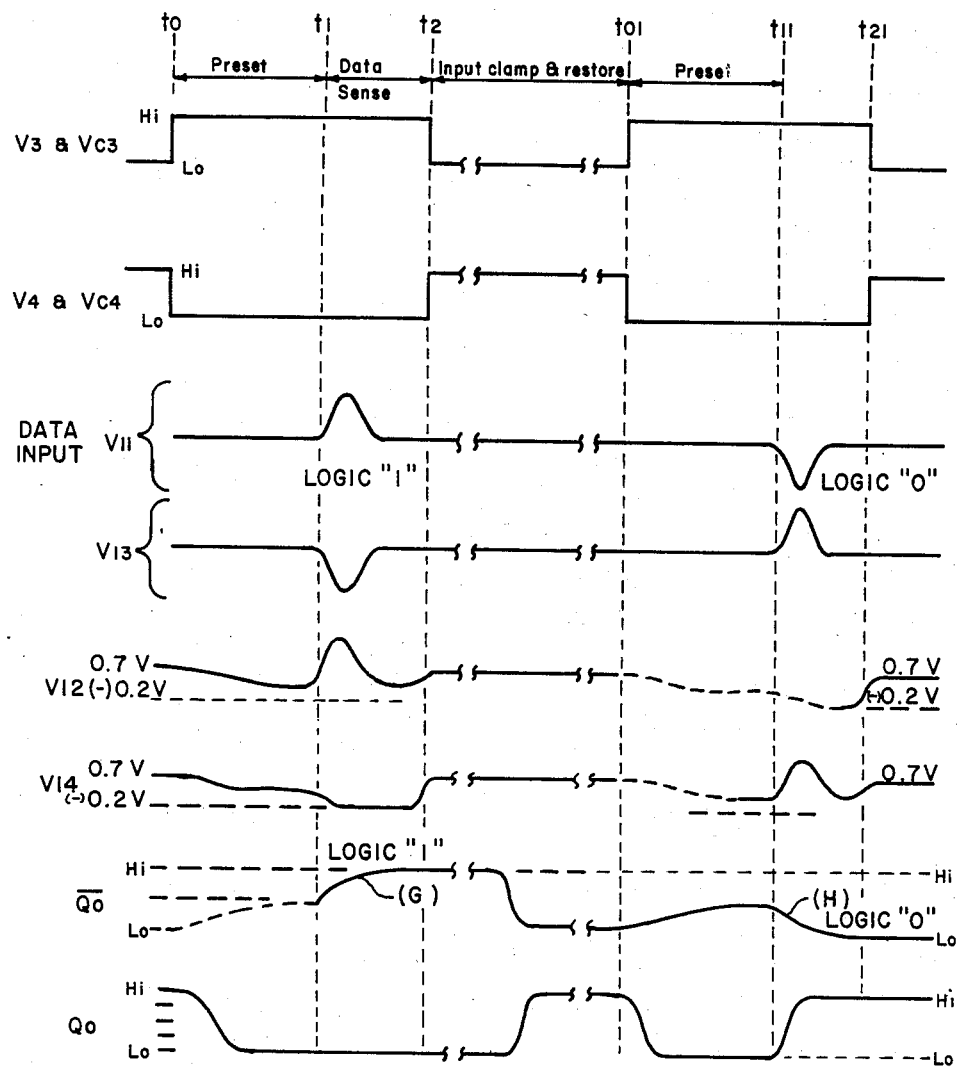
FIG. 2 is a diagram of waveforms associated with the circuit of FIG. 1.

The circuit of FIG. 1 may be operated in the following three modes as shown in FIG. 2: The "preset" mode is initiated at a time $t_0$ when control signals $V_3$ and $V_{C3}$ go high and $V_4$ and $V_{C4}$ go low. The data "read" or "sense" mode is initiated at a time $t_1$ when data signals are applied to the circuit. The "restore" or "steady state" mode, which existed prior to time $t_0$, is reestablished at time $t_2$ when $V_3$ and $V_{C3}$ go low and $V_4$ and $V_{C4}$ return to the high level.

Before each data "read" or "sense" period the circuit is first "preset", when, as shown at time $t_0$, $V_3$ and $V_{C3}$ go high and $V_4$ and $V_{C4}$ go low. $V_3$-high turns-on Q3 and $V_4$-low turns-off Q4. The turn-on of Q3 selects and enables the differential amplifier (Q1, Q2) by providing a path for the passage of emitter current (e.g. I5) between node A and terminal 16. Concurrently, $V_{C4}$-low causes Q12 to turn-off. With Q12 turned-off emitters 62 and 72 of Q6 and Q7, respectively, are no longer clamped to ground and the signals applied to emitters 61 and 71 via Q1 and Q2 will determine the state of flip-flop 20. At time $t_0$ the $V_{C3}$-high signal applied to the base of Q10 disables clamping circuit 30. For the reasons discussed below it may be assumed that at time $t_0$ the clamping circuit leaves the differential amplifier biased such that the potential ($V_{BQ1}$) at the base of Q1 is equal to the potential ($V_{BQ2}$) at the base of Q2 and that $V_{BQ1} = V_{BQ2} = 0.7$ volt.

Thus, an instant after time $t_0$, the following conditions exist:

(a) a relatively constant current (I5) is supplied to the emitters of Q1 and Q2; (b) the bases of Q1 and Q2 are at nearly the same values of potential (i.e. approximately 0.7 volt); and (c) the $V_{BE}$ (i.e. 0.6 volt) of Q1 is less than the $V_{BE}$ (i.e. 0.7 volt) of Q2.

Although the same potential is applied to the bases of Q1 and Q2, since the $V_{BE}$ of Q1 is less than that of Q2, Q1 conducts more heavily than Q2 and causes a potential to be developed at node A, which tends to turn-off Q2. Thus Q1 turns-on heavily and Q2 is either hardly conducting or turned-off. When Q1 turns-on its collector and the emitter 61 of Q6 are pulled down close to ground potential while the collector of Q2 and the emitter 71 of Q7 can float at some indeterminate level between ground and $V_{CC}$. When the collector of Q1 and the emitter 61 of Q6 are driven close to ground potential, Q6 is turned-on and its collector (Qo) is brought close to ground potential causing Q7 to be turned off. When Q6 is turned-on it discharges C4 and terminal 17 via its collector-to-emitter path close to the "low" level present at its emitter 61. When Q7 is turned-off its collector ($\overline{Qo}$) is driven towards $V_{CC}$ via R2. This provides additional base drive to Q6 ensuring its continued turn-on and the eventual clamping of the collector (Qo) of Q6 to the low level. Concurrently R2 continues to charge capacitor C3 towards $V_{CC}$ ensuring the rise of $\overline{Qo}$ and the voltage at node 19 towards $V_{CC}$. At the termination of the preset period, at time $t_1$, as shown for waveform $\overline{Qo}$ in FIG. 2, the flip-flop is preset such that $\overline{Qo}$ and the large capacitance C3 associated with terminal 19 are charged to a point which is somewhere between the "high" (i.e. $V_{CC}$) and the "low" (i.e. ground) levels. Concurrently, the Qo output which can respond quickly is discharged to the "low" level.

A data "read" or "sense" period is initiated at a time $t_1$, as shown in FIG. 2, when data input signals are applied to terminals 11 and 13 from memory array 32. If a logic "1" is present, the data input signals consist of a positive pulse on 11 and a negative pulse on 13. If a logic "0" is present the data input signals consist of a negative pulse on 11 and a positive pulse on 13. The amplitude of the pulses is typically greater than 1 volt.

It may be assumed that during the interval from $t_0$ to $t_1$, the potentials at the bases of Q1 and Q2 may decay into a negative direction from the 0.7 volt level. But as explained below the bias network 30 prevents one bias from going more negative than −0.2 volt. Hence, if, at time $t_1$, a positive of more than 1 volt amplitude pulse is applied to terminal 11 and a negative pulse is applied to terminal 13, Q1 which is already turned-on remains ON, and Q2 which is already hardly conducting or turned-off is turned-off. If Q1 was not fully turned-on prior to $t_1$ it is now (at time $t_1$) driven to the full ON condition and if Q2 was not fully turned-off it is now driven to the full off condition. Q6 is then either fully turned-on or driven to the full-ON condition and Q7 is either fully turned-off or driven to the full-OFF condition. Thus, when a logic "1" signal is applied to the circuit, the circuit continues to go to the condition initiated when the circuit was preset, as shown for section G of waveform $\overline{Qo}$ in FIG. 2. The time needed for the circuit to reach the steady state "1" condition is then well within specified limits. Measuring from the point in time ($t_1$) when data is applied to the circuit it is evident that the circuit can reach the state of $\overline{Qo}$=high ($V_{CC}$) in a much less time than would otherwise be needed if presetting were not employed.

If a positive pulse is applied to terminal 13 and a negative pulse is applied to terminal 11, as shown at time $t_{11}$, Q1 is turned-off and Q2 is turned-on. The turn-on of Q2 causes emitter 71 of Q7 to be driven low and Q7 to turn-on discharging $\overline{Qo}$ (terminal 19 and C3) towards ground potential very quickly via the collector-to-emitter path of Q7. Thus although $\overline{Qo}$ and C3 were charged towards $V_{CC}$ they can be quickly discharged to the low level as shown in section H of waveform $\overline{Qo}$ of FIG. 2. Lowering the potential at the collector of Q7 decreases the potential applied to the base of Q6. Since Q1 is already turned-off and emitters 62 and 72 are floating, Q6 is quickly turned-off and its collector is easily and quickly charged toward $V_{CC}$ via R1. Where, as noted above, the capacitance C4 associated with terminal 17 is one-tenth the capacitance C3 (i.e. C4=C3/10) associated with terminal 19, the time to charge output 17 to the "high" level is always well within desired limits. Thus when a "0" is applied to the circuit, the "preset" conditioning of the flip-flop to the "1" state has to be reversed. But, since the "0" state is the state for which the circuit reacts quickly that condition is reached well within the time specified as shown in FIG. 2.

It should be appreciated that the forward current gain ($\beta$) of Q1 and Q2 are very similar. Thus the differential amplifier comprised of Q1 and Q2 functions to control the presetting of the flip-flop without adversely affecting the setting of the flip-flop when data signals are subsequently applied. As discussed above, during the preset portion of the sense cycle a current I5 is coupled to flip flop 20 via the collector-to-emitter path of the differential amplifier transistor (e.g. Q1) which was made larger than the other. However, when data is applied to the sense circuit, it is the one of the two differential amplifier transistors whose base is driven more positive which controls. During "preset" transistors Q1 and Q2 are operated in the common mode. During the data sensing portion of the cycle the transistor whose base is driven more positive is operated in the common emitter mode and the other is turned-off. Operating the differential amplifier in these two modes enables the differential amplifier to be used effectively for both presetting and data sensing.

The response of the Q1 and Q2 differential stage is fast due in part to the fact that Q1 and Q2 are prevented from saturating during preset.

For ease of discussion it was assumed above that the capacitance at node 19 was significantly greater than the capacitance at node 17. In fact, the capacitance at nodes 17 and 19 may be nearly equal. However, a similar problem to the one discussed above is present and a similar solution is instituted where the capacitance (e.g. C3a in FIG. 1) at the output of one of the logic gates (e.g. LG2) is much larger than the capacitance (e.g. C4a) at the output of the other logic gate (e.g. LG1).

For example, LG1 and LG2 may be non-inverting buffers connected at their inputs to output terminals 17 and 19, respectively, and connected at their outputs, OL1 and OL2, to capacitance C4a and C3a, respectively. Assume as before, that C3a is 10 times the size of C4a. For the assumed values of capacitance, the output OL2 of LG2 would be precharged towards $V_{CC}$ during the preset portion of a read cycle. Then, depending on whether a "1" or a "0" data input were applied to the differential amplifier the output at OL2 would continue towards $V_{CC}$ as shown in waveform G (for a logic "1") or else the output would be driven to ground as shown in waveform H (for a logic "0").

Logic gates LG1 and LG2 may be inverting gates rather than non-inverting buffers. For such a circuit configuration, and assuming C3a to be larger than C4, Q2 would be made larger than Q1 to cause the $V_{BE}$ of Q2 to be lower than that of Q1 to cause OL2 to be driven towards $V_{CC}$ during preset. Of course, if C4a were greater than C3a, Q1 would be made greater than Q2 to cause OL1 to be charged towards $V_{CC}$ during preset.

The differential amplifier is biased and set up by means of network 30 of FIG. 1 which has two operating modes. Network 30 is "enabled" and functions to hold the bases of Q1 and Q2 at approximately 0.7 volt prior to the application of a preset signal (i.e. during restore). The clamp network is "disabled" and releases the bases of Q1 and Q2 which can then be driven by, and respond to, input signals applied to terminals 11 and 13 during the "preset" and "sense" periods.

During "Restore" and prior to the preset period (i.e. before time $t_0$) the control signal VC3 is low and transistor Q10 is turned off. A current I1 then flows from $V_{CC}$ via R11 into node E. Part of this current then flows via diode D1 into the bases of Q8 and Q9 forward biasing these two transistors. A current which is Beta (the forward current gain) times the current into the base of Q8 then flows from node E via diode D2 and the collector-to-emitter path of Q8 to ground. A like current also flows from node E via diode D3 and the collector-to-emitter path of Q9 to ground. Since D2 and D3 are made similar and since Q8 and Q9 are similar, the base and collector currents though Q8 and Q9 will be very nearly identical. Q8 and Q9 are forward biased and may be turned-on hard. However, Q8 and Q9 are prevented from going into saturation and the voltages at their collectors is held at $V_{BE}$ volts (approximately 0.7 volt), as demonstrated by the following analysis. There are three parallel paths between node E and ground. Namely: (1) diode D1 in series with the base-to-emitter junctions of Q8 or Q9; (2) diode D2 in series with the collector-to-emitter of Q8; and (3) diode D3 in series with the collector to emitter of Q9. Assuming the forward voltage drops of diodes D1, D2 and D3 to be approximately equal it can be shown that the collector-to-emitter voltage ($V_{CE}$) of Q8 or Q9 must be approximately equal to the base-to-emitter voltage ($V_{BE}$) of Q8 or Q9.

The potential ($V_E$) at node E is equal to the $V_{BE}$ of Q8 or Q9 plus the forward voltage drop ($V_{FS}$) of diode D1. When Q8 and Q9 are turned-on, the voltage at their collectors is equal to $V_E$ less the forward drop ($V_{FS}$) of D2 or D3. Since $V_E$ is equal to $V_{BE}$ plus $V_{FS}$ and since the $V_{FS}$ of diodes D1, D2 and D3 are assumed equal, then the voltage ($V_C$) at the collectors of Q8 and Q9 is approximately equal to $V_{BE}$ volts.

The voltage ($V_C$) at the collectors of Q8 and Q9 is regulated by means of feedback via the collector diodes D2 and D3. For example, if the $V_C$ of Q8 drops below $V_{BE}$ then the voltage ($V_{E1}$) at node E drops below $V_{BE}$ plus $V_{FS}$. When that happens, the voltage ($V_D$) at node D which is equal to $V_E - V_{FS}$ drops below $V_{BE}$. Decreasing $V_D$ below $V_{BE}$ causes a decrease in the base current to Q8 which results in a decrease in the collector current through Q8. Decreasing the collector current of Q8 causes less current to flow through R11. A drop in current through R11 causes the potential at nodes E and D and at the collector of Q8 to increase. $V_C$ of Q8 which is equal to the $V_B$ of Q1 is thus regulated and maintained at $V_{BE}$ volts. The $V_C$ of Q9 and the $V_B$ of Q2 is similarly controlled. Thus network 30 provides a regulated bias voltage at its outputs (i.e. the collectors of Q8 and Q9). This bias voltage can then be used to reliably bias the inputs of a differential amplifier stage.

Q8 and Q9 are operated in the linear region whereby the potentials at their collectors and at the bases of Q1 and Q2 are regulated and can be maintained at approximately the same levels. Maintaining the potential at the bases of Q1 and Q2 nearly equal is important since a differential in excess of 100 millivolts might cause an erroneous switching of the differential amplifier transistors.

Developing and applying a potential of $V_{BE}$ volts to the bases of transistors Q1 and Q2 ensures that Q1 and Q2 are biased on the verge of conduction during preset. Thus transistors Q1 and Q2 are biased at a point which enables them to respond very quickly in response to a data input signals at time $t_1$.

Since Q8 and Q9 are operated in the linear region (i.e. they are kept out of saturation) they can be turned-off very quickly when at time $t_0$ a preset signal $V_{C3}$ turns-on Q10 and clamps node E to the $V_{CE\ SAT}$ of Q10. Obviously they can turn-on very quickly when Q10 is turned-off.

In clamp circuit 30 the base and collector currents of transistors Q8 and Q9 flow through resistor R11. Thus voltage regulation is obtained using very few components interconnected in a very simple circuit.

The operation of the clamping circuit during the "preset" and data "sense" periods is as follows. At time $t_0$, transistor Q10 is turned-on. This clamps node E to the $V_{CE\ SAT}$ (assumed to be approximately 0.3 volt) of Q10 and turns-off Q8 and Q9, disabling network 30. When Q8 and Q9 are first turned-off, the potentials on the plates of C1 and C2 connected to the bases of Q1 and Q2 will be at, or close to, 0.7 volt. Since Q8 and Q9 are turned-off they now appear as extremely high impedances connected to the bases of Q1 and Q2 and have negligible effect on the operation of the circuit. The potential at the bases of Q1 and Q2 (nodes 12 and 14, respectively) does not change very much during the preset period in the absence of signals or noise at the input terminals. Since Q8 and Q9 are turned off and present a high impedance, only the relatively small currents flowing into the bases of Q1 and Q2 cause the voltage at nodes 12 and 14 to discharge towards a negative level. The base currents into Q1 and Q2 are, approximately, 1/Beta the value of their emitter current. Thus where I5 is in the order of 1 milliampere and Beta is in the order of 100 the base currents into each one of Q1 and Q2 is less than 0.01 milliamperes. Assuming C1 and C2 to be approximately 50 picofarads and the preset interval to be 100 nanoseconds, the voltage at nodes 12 and 14 would discharge by a few hundredths of a volt (0.01 volt to 0.03 volt). Thus, in the absence of noise signals coupled to the input terminals (11, 13 and 12, 14), the bases of Q1 and Q2 would remain close to the bias value of 0.7 volt during preset.

However, noise signals may be coupled to the input terminals during preset tending to cause the bases of Q1 and Q2 to go positive or negative. [It is assumed that noise signals would appear with essentially the same amplitude at both input terminals]. As long as the noise signals drive both inputs positive by the same amount the circuit will respond correctly to the differential data input signals (so long as both inputs are not driven deep into saturation). However if the noise signals were capable of driving both inputs to a highly negative level, then, the differential data input signals might not be able to switch the differential amplifier in response to the data input signals.

This problem is solved with the network 30 by allowing nodes 12 and 14 to go to a relatively large positive voltage during the restore period while preventing the voltages at these nodes from going much below −0.2 volt as shown by the following analysis.

When node E is clamped via Q10, the minimum voltage ($V_E$) at node E is equal to the $V_{CE\ SAT}$ of Q10. As noted above $V_{CE\ SAT}$ may be assumed to be equal to 0.3 volt. Recall from above that the $V_{FS}$ of diodes D1, D2, and D3 is 0.5 volt. Hence, whenever the voltage at one of nodes 12, 14, or D drops below −0.2 volt, the diode connected to that node will conduct in the forward direction tending to clamp that node at −0.2 volt. Hence any negative going data signal applied to input terminals 11 and 13 and A.C. coupled to the bases of Q1 and Q2 cannot cause the potential at nodes 12 and 14 to go much more negative than −0.2 volt, since diodes D2 and D3 clamp the voltages at nodes 12 and 14 to approximately −0.2 volt. This is illustrated in waveforms V12 and V14 of FIG. 2.

On the other hand, any positive data signal applied to input terminals 11 or 13 is A.C. and coupled to the bases of Q1 or Q2 is superimposed on the existing base bias potential. These signals can go more positive than −0.2 volt as shown in FIG. 2 without interference from network 30 since any potential at nodes 12 or 14 more positive than −0.2 volt tends to reverse bias diodes D2 and D3. [Of course, it is assumed that the positive signals do not exceed the reverse breakdown of the diodes or the breakdown of the transistor junctions.]

At the end of the sense period (e.g., at time t2) the clamp circuit 30 is again enabled when Q10 is turned-off. The clamp/bias circuit 30 then quickly restores the potential at nodes 12 and 14 to the bias voltage of approximately 0.7 volt erasing any residual imbalance at node 12 and 14 remaining from the previous data input signals.

Figure 3:
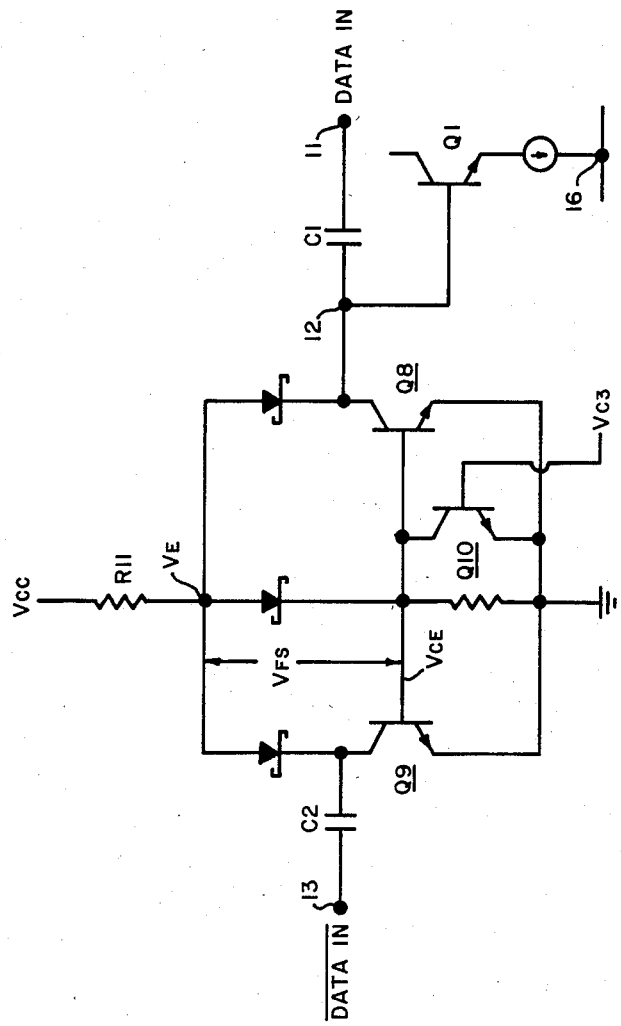
FIGS. 3 and 5 are schematic diagrams of other bias circuits embodying the invention.
Figure 4:
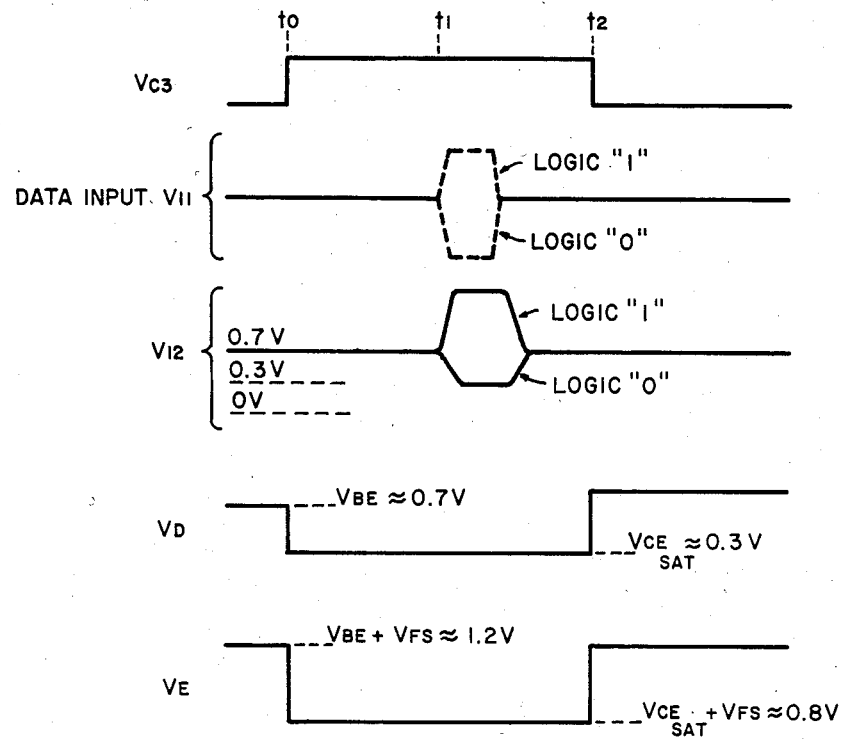
FIG. 4 is is a diagram of waveforms associated with the circuit of FIG. 3.

In the circuit of FIG. 1, the collector of transistor Q10 was connected to node E. The collector of Q10 may be instead connected to node D as shown in FIG. 3. The effect of this connection is to turn-off Q8 and Q9 faster and to prevent the voltages at the collectors of Q8 and Q9 from going much more negative than +0.3 volt as shown in the waveforms of FIG. 4.

In the circuits of FIGS. 1 and 3 a single diode is connected between node E and each one of nodes 12, 14 and D. The use of a single diode ensures that the collector voltages of Q8 and Q9 are nearly equal to their base voltages and that the collector voltages are close to $V_{BE}$ volts above ground when the emitters of Q8 and Q9 are grounded.

Figure 5:
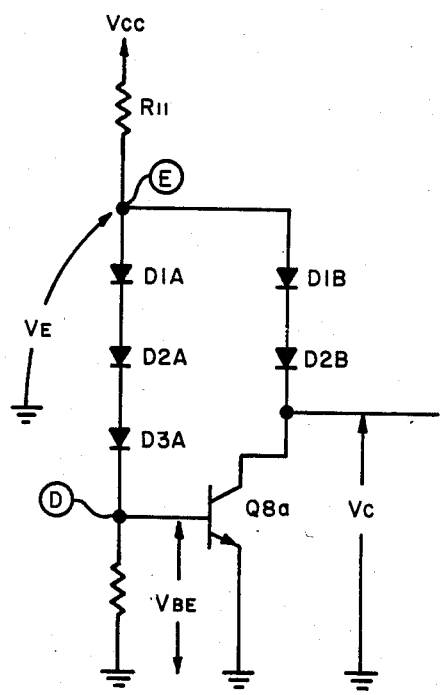

A wide range of collector voltages may be obtained by varying the number of diodes in the base and collector legs of transistor Q8 (or Q9) as shown in FIG. 5. For example, in FIG. 5, three PN diodes (D1A, D2A, D3A) are shown connected between nodes E and D, and two PN diodes (D1B, D2B) are shown connected in series between node E and the collector of a transistor Q8a whose emitter is grounded.

Assuming that the diodes have similar characteristics, the voltage at node E may be expressed as:

$$V_E = V_{BE} \text{ of } Q8a + 3V_F \qquad \text{(eq. 1)}$$

The voltage $V_C$ at the collector of Q8a may then be expressed as $$V_c = V_{BE} + 3V_F - 2V_F \qquad \text{(eq. 2)}$$

$V_C$ would then be equal to $V_{BE} + V_F$. For $V_{BE}$ and $V_F$ equal to 0.7, $V_C$ would be equal to 1.4 volts.

In general if "M" diodes are connected between nodes E and D and "N" diodes are connected between node E and the collector of Q8a, where M and N are integers equal to or greater than 1, $V_E$ and $V_C$ may be expressed as follows:

$$V_E = V_{BE} + MV_F, \text{ and} \qquad \text{(eq. 3)}$$

$$V_C = V_{BE} + (M-N)V_F \qquad \text{(eq. 4)}$$

To prevent the transistor Q8a from going into saturation the number "M" should always be equal to or greater than the number N; (i.e. $M \geq N$).

The voltage $V_C$ can thus be arranged to have several different values by suitably selecting the number of diodes in the base and the collector legs.

The invention has been illustrated using transistors of one conductivity type (i.e. NPN bipolars). It should be evident that PNP transistors could be used instead and that different types of transistors could also be used.

What is claimed is:

1. The combination comprising:

first and second power terminals for the application therebetween of an operating potential;
an output node;
a transistor having a base, an emitter and a collector;
means connecting said collector to said output node and said emitter to one of said first and second power terminals;
an intermediate node;
first and second diodes;
means connecting said first diode between said intermediate node and the base of said transistor, said first diode being poled to conduct current in the same forward direction as the base-to-emitter of said transistor;
means connecting said second diode between said intermediate node and the collector of said transistor, said second diode being poled to conduct current in the same forward direction as the collector-to-emitter of said transistor; and
a current passing means coupled between the other one of said first and second power terminals and said intermediate node for supplying the base and collector currents of said transistor.

2. The combination as claimed in claim 1 further including a signal responsive transistor connected at its base to said output node.

3. The combination as claimed in claim 1 further including an input terminal coupled to receive input signals and a capacitor connected between said input terminal and said output node.

4. The combination as claimed in claim 1 further including means for selectively turning off said transistor and preventing current flow therethrough.

5. The combination as claimed in claim 4 wherein said means for selectively turning-off said transistor includes means connected between the base and emitter of said transistor for turning it off.

6. The combination as claimed in claim 4 wherein said means for selectively turning-off said transistor includes means connected between said intermediate node and said emitter of said transistor for clamping said intermediate node to the voltage at said emitter.

7. The combination as claimed in claim 1 wherein said current passing means is a resistor connected between said other one of said first and second power terminals and said intermediate node, and wherein said resistor is the sole steady state current source for the base and collector currents of said transistor.

8. The combination as claimed in claim 1 further including a second output node and a second transistor having a base, an emitter and a collector,
wherein the collector of said second transistor is connected to said second output node; and
wherein the base and emitter of said second transistor are respectively connected to the base and emitter of said transistor.

9. The combination comprising:

first and second power terminals for the application therebetween of an operating potential;
first and second output nodes for producing thereat first and second bias voltages;
first and second transistors, each transistor having a base, an emitter and a collector;
means connecting the collector of said first transistor to said first output node and the collector of said second transistor to said second output node;
means connecting the emitters of said first and second transistor to one of said first and second power terminals;
an intermediate node;
first, second and third diodes;

means connecting said first diode between said intermediate node and the bases of said transistors, said first diode being poled to conduct current in the same forward direction as the base-to-emitter junctions of said transistors;

means connecting said second diode between said intermediate node and the collector of said first transistor, and means connecting said third diode between said intermediate node of the collector of said second transistor, said second and third diodes being poled to conduct current in the same forward direction as the collector-to-emitter paths of said first and second transistors; and a current passing means coupled between the other one of said first and second power terminals and said intermediate node for supplying the base and collector currents of said transistors.

10. The combination as claimed in claim 9 further including third and fourth transistors respectively connected at their bases to said first and second output nodes, and further including first and second signal input terminals and first and second capacitors, said first capacitor being connected between said first input terminal and said first node, and said second capacitor being connected between said second input terminal and said second output node.

* * * * *

UNITED STATES PATENT AND TRADEMARK OFFICE
CERTIFICATE OF CORRECTION

PATENT NO. : 4,567,381
DATED : Jan. 28, 1986
INVENTOR(S) : Douglas S. Piasecki

It is certified that error appears in the above-identified patent and that said Letters Patent is hereby corrected as shown below:

Col. 1, line 7, change "F04704-78C-0021" to - - - F04704-78-C-0021 - - -.
Col. 7, line 24, change "$(V_{E1})$" to - - - $(V_E)$ - - -.
Col. 7, line 26, change "Decreasin" to - - - Decreasing - - -.
Col. 7, lines 55 and 56, change "turn-s-on" to - - - turns-on - - -.
Col. 9, line 54, change "M≧N" to - - - M≧N - - -.
Col. 12, line 11, after "first" insert - - - output - - -.

Signed and Sealed this

Nineteenth Day of August 1986

[SEAL]

Attest:

DONALD J. QUIGG

Attesting Officer

Commissioner of Patents and Trademarks